US006721221B2

(12) United States Patent
Schreck (10) Patent No.: US 6,721,221 B2
(45) Date of Patent: Apr. 13, 2004

(54) SENSE AMPLIFIER AND ARCHITECTURE FOR OPEN DIGIT ARRAYS

(75) Inventor: John Schreck, Lucas, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/876,095

(22) Filed: Jun. 8, 2001

(65) Prior Publication Data

US 2002/0186607 A1 Dec. 12, 2002

(51) Int. Cl.[7] ................................................. G11C 7/02
(52) U.S. Cl. .................... 365/208; 365/207; 365/230.03
(58) Field of Search ................................ 365/202, 207, 365/208, 230.03

(56) References Cited

U.S. PATENT DOCUMENTS

| 4,888,732 A | 12/1989 | Inoue et al. | |
|---|---|---|---|
| 4,903,344 A | 2/1990 | Inoue | |
| 5,313,426 A | * 5/1994 | Sakuma et al. | 359/160 |
| 5,661,691 A | 8/1997 | Lin | |
| 6,128,227 A | * 10/2000 | Kim | 365/185.2 |
| 6,243,313 B1 | * 6/2001 | Sakamoto et al. | 365/207 |
| 6,373,776 B2 | * 4/2002 | Fujisawa et al. | 365/230.03 |
| 6,385,101 B1 | * 5/2002 | Chang et al. | 365/190 |

FOREIGN PATENT DOCUMENTS

BA     1 152 432 A1    of 0000

* cited by examiner

Primary Examiner—Van Thu Nguyen
(74) Attorney, Agent, or Firm—Dickstein Shapiro Morin & Oshinsky, LLP (57) ABSTRACT

A method and apparatus are described which provide a memory device with sense amplifiers extending in a first direction and corresponding digit lines extending in a second direction perpendicular to the first direction. A pair of complementary digit lines may originate from different memory sub-arrays. The arrangement is particular useful for memory arrays having 6F**2 feature size.

51 Claims, 8 Drawing Sheets

FIG. 1

PRIOR ART

FIG. 2

PRIOR ART

FIG. 8

SENSE AMPLIFIER AND ARCHITECTURE FOR OPEN DIGIT ARRAYS

BACKGROUND OF THE INVENTION

I. Field of the Invention

The present invention relates generally to systems which utilize memory array architectures. More specifically, the invention relates to a system and method for an improved sense amplifier architecture.

II. Description of the Related Art

Electronic systems typically store data during operation in a memory device. Dynamic random access memory (DRAM) is very popular as a data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a digit line that is coupled to at most one cell in each row. Thus, the word and digit lines can be controlled so as to individually access each cell of the array.

To read data out of a cell, the capacitor of a cell is accessed by selecting the word line associated with the cell. A complementary digit line that is paired with the digit line for the selected cell is equilibrated to an equilibrium voltage. This equilibration voltage (Veq) is typically midway between the high Vcc and low Vss (typically ground) logic levels. Thus, conventionally, the digit lines are equilibrated to one-half of the power supply voltage, VCC/2. When the word line is activated for the selected cell, the capacitor of the selected cell discharges the stored voltage onto the digit line, thus changing the voltage on the digit line.

Figure 1:
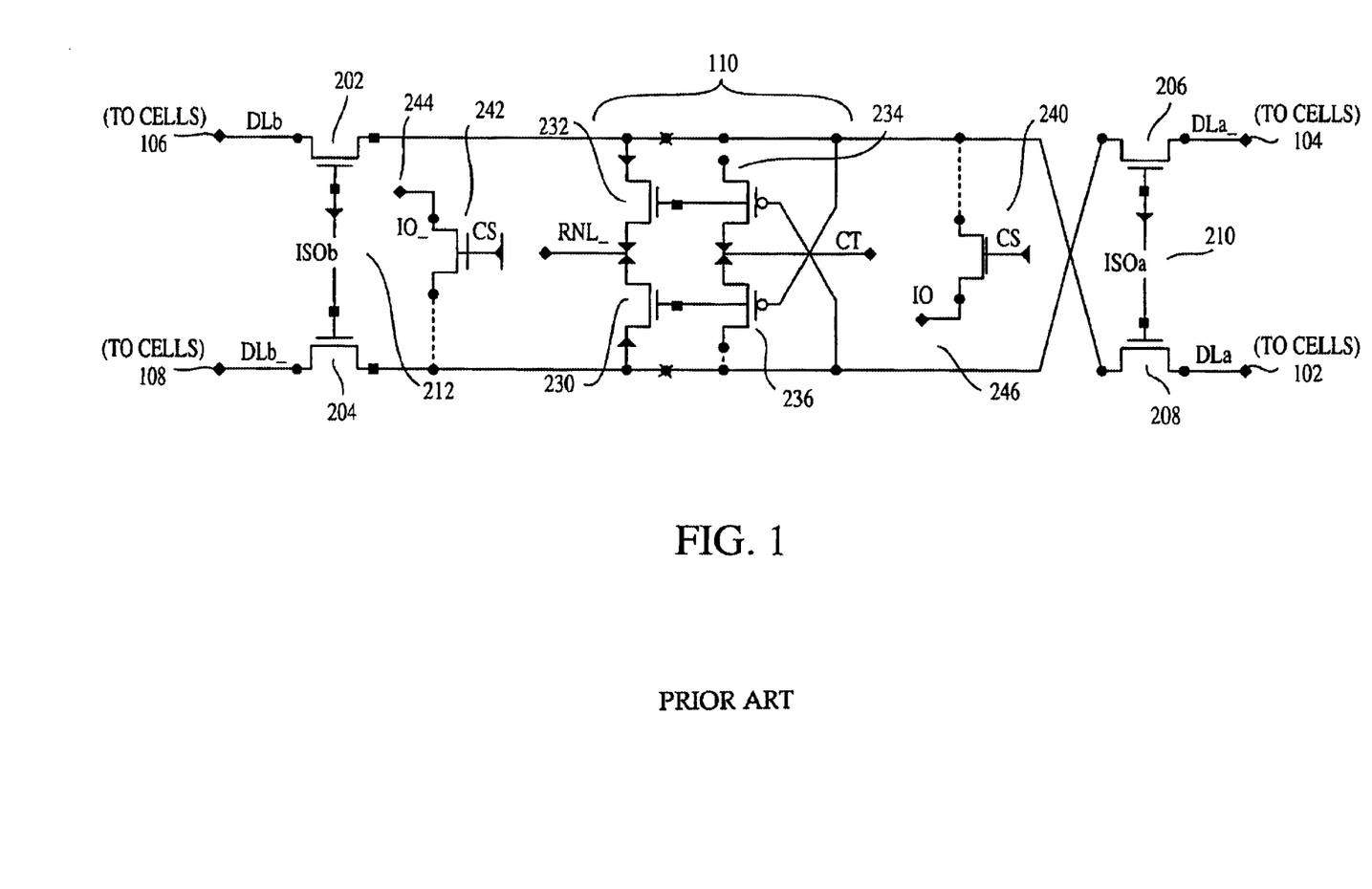
FIG. 1 is an illustration of a schematic diagram for a memory device employing an interleaved folded digit line layout for shared sense amplifiers.

Referring to FIG. 1, a sense amplifier 110 detects and amplifies the difference in voltage on the pair of digit lines. The sense amplifier 110 typically includes two main components: an n-sense amplifier and a p-sense amplifier. As illustrated in FIG. 1, the n-sense amplifier includes a cross-coupled pair of n-channel transistors 230, 232, in which the gates of the transistors 230, 232 may be coupled to the digit lines 102 and 104 or 106 and 108. Thus, during a read operation, the n-channel transistors 230, 232 are initially driven by the equilibration voltage on the digit lines 102 and 104 or 106 and 108. The n-sense amplifier is used to drive a low digit line to ground. The p-sense amplifier includes a cross-coupled pair of p-channel transistors 234, 236 and is used to drive a high digit line to the power supply voltage.

An input/output device for the array, typically an n-channel transistor 240, 242, passes the voltage on the digit line 102, 104 or 106, 108 for the selected cell to an input/output line 244, 246 for communication to, for example, a processor of a computer or other electronic system associated with the DRAM. In a write operation, data is passed from the input/output lines 244, 246 to the digit lines 102, 104, 106, 108 by the input/output device 240, 242 of the array for storage on the capacitor in the selected cell.

Each of the components of a memory device are conventionally formed as part of an integrated circuit. To more effectively use the area of the integrated circuit, the memory array may include sub-arrays which may have sense amplifier circuitry shared amongst the sub arrays. In such memory devices, the sub-arrays are coupled to the sense amplifier 110 through isolation transistors 202, 204, 206, 208, typically n-channel transistors. The n-channel isolation transistors 202, 204, 206, 208, selectively couple the sense amplifier 110 to the digit lines 106 and 108 or 102 and 104 for a data reading or writing operation, as is well known in the art.

Figure 2:
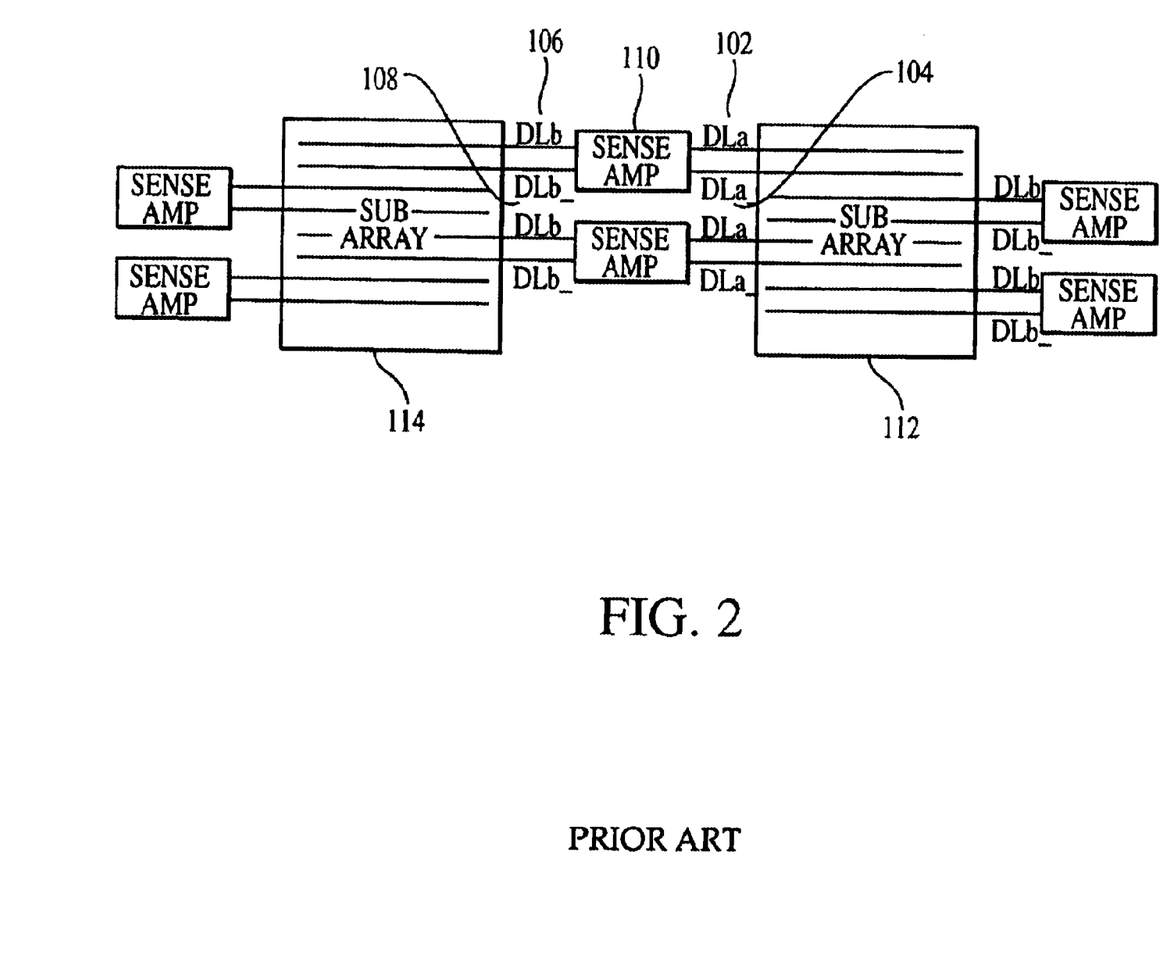
FIG. 2 is an illustration of a shared sense amplifier and multiple digit lines in accordance with an interleaved folded digit line layout.

The above arrangement of shared sense amplifiers is illustrated on a higher level in FIG. 2 and is commonly referred to as an interleaved folded scheme. In this scheme digit pairs (e.g., two digit lines) are interleaved and run next to each other inside a sub-array 112, 114. Each digit pair forms a true and complement combination which is read by and written to by a sense amplifier 110. Each of the digits lines, e.g. 102, of a pair, e.g. 102, 104, is coupled to a memory cell of a sub-array, each cell including a capacitor connected through an access transistor to the digit line. Referring to FIGS. 1 and 2, the digit pair 102, 104 is connected to a sense amplifier 110 by a pair of isolation transistors 206, 208. Also, sharing the same selected amplifier 110 is another digit pair 106, 108 from another sub-array 114. Digit pair 106, 108 is isolated from the sense amplifier 110 by isolation transistors 202, 204 during sensing of digit pair 102, 104. As shown in FIG. 1, this isolation occurs, for example, by turning off a pair of isolation transistors 202, 204 between the sense amplifier 110 and digit pair 106, 108. The interleaved folded scheme requires that one sense amplifier fit in the space of 4 digit lines of the adjacent arrays. The interleaved folded digit line scheme works well with 8F2 type memory cells, which are commonly used with such a scheme. The name, 8F2, is descriptive of the area each memory cell occupies in terms of the industry standard "F units."

Another known memory cell arrangement is known as 6F2 cells. The 6F2 cells are different from the 8F2 cells in that for an interleaved folded scheme a sense amplifier 110 must fit into the width of two (2) digit lines rather than within the space of four (4) digit lines as are used with 8F2 cells. While 6F2 memory cells can be utilized with the same sense amplifier layout shown in FIG. 1, this may require extremely tight design rules or additional interconnects. Therefore, there exists a need for a more efficient sense amplifier scheme layout which is better suited for 6F2 memory cells.

SUMMARY OF THE INVENTION

The present invention relates to a sense amplifier layout for use with 6F2 memory cells. The layout uses an open digit architecture where digit lines fed from each adjacent sub array do not share sense amplifiers. This open digit architecture utilizes a perpendicular orientation of the sense amplifier length with respect to the digit lines. This layout allows for an efficient memory array system using 6F2 memory cells, while avoiding the complexities of implementing an interleaved folded scheme for 6F**2 memory cells.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

Figure 3:
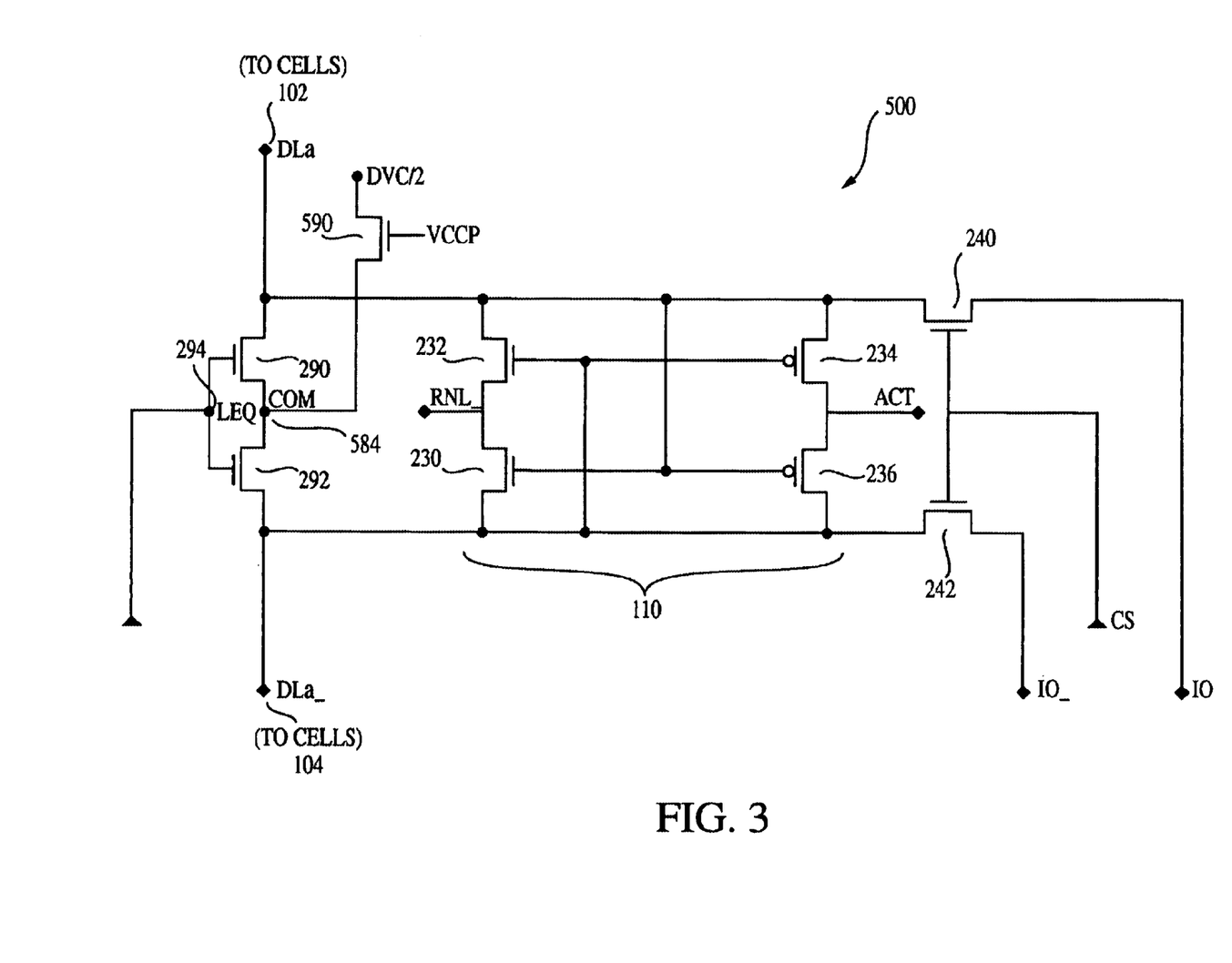
FIG. 3 is an electrical schematic diagram of a memory device fabricated in accordance with an exemplary embodiment of the invention and including an open digit array sense amplifier arrangement in which the digit lines run perpendicular to the length of the sense amplifier.
Figure 4:
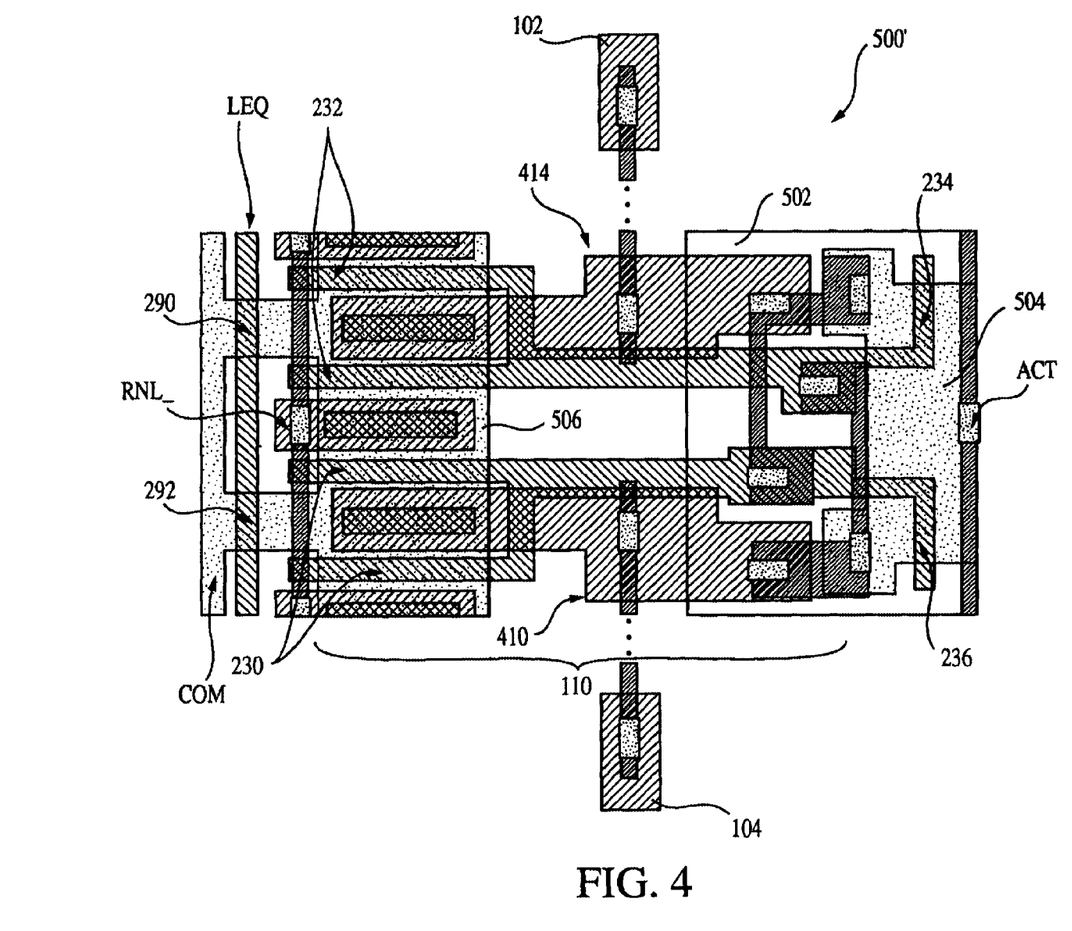
FIG. 4 is a layout illustration of a portion of the memory device illustrated in FIG. 3.
Figure 5:
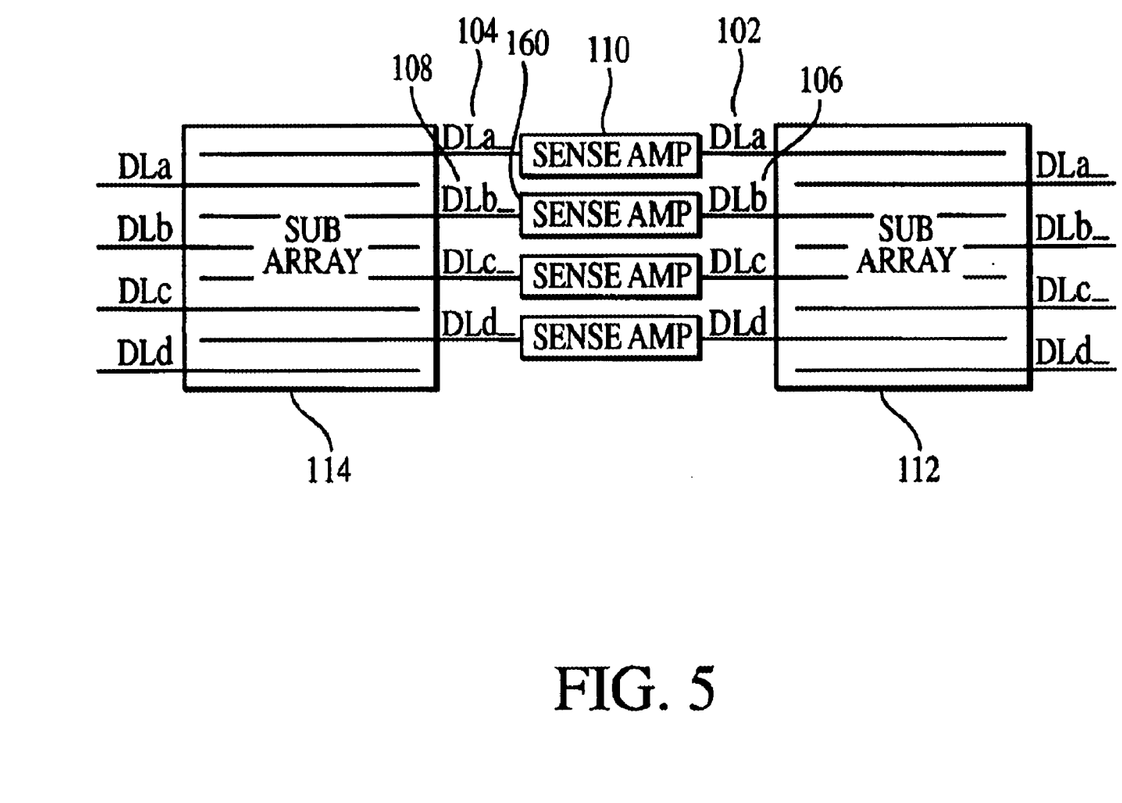
FIG. 5 is an illustration of the open digit architecture in accordance with another exemplary embodiment of the present invention.

Referring now to the drawings, where like reference numerals designate like elements, FIG. 3 illustrates a schematic diagram of a circuit for a memory device 500 employing an open digit array sense amplifier arrangement in which the length of the sense amplifier 110 (shown running horizontally in FIG. 4) is perpendicular to the extending direction of digit lines 102, 104 (shown extending vertically in FIG. 4). Since multiple memory sub-arrays are not coupled via multiple digit lines to the same sense amplifier 110 (i.e., the sense amplifier 110 is not shared), isolation transistors are not needed, unlike the conventional arrangement illustrated in FIGS. 1 and 2. As shown in FIG. 5, the two digit lines 102, 104 used for the comparisons performed by sense amplifier 110 are taken from two different sub arrays on either side of a sense amplifier 110. It should be understood that although isolation transistors 202, 204, 206, 208 (FIG. 1) are not required, they may be included without departing from the spirit or scope of the invention.

Referring to FIG. 3, equalization of digit lines 102, 104 is accomplished by connecting them to a common node COM 584 of two n-channel transistors 290, 292. By controlling the voltage at node LEQ 294, which enables or disables n-channel transistors 290, 292 at the same time, transistors 290, 292 may be turned on at the same time to couple the digit lines 102, 104, at the common mode COM 584, thereby equalizing them. Since the digit lines 102, 104 are separated by a value equal to VCC, the resulting potential at the common node COM 584 is VCC/2. A voltage source DVC/2 (e.g., at VCC/2) is coupled through a source voltage element, e.g., a Vccp transistor 590 as shown in FIG. 3, to hold the common node COM 584 at VCC/2. It should be understood that a Vccp transistor 590 is not required, however, and other source voltage elements may be used in place of or in combination with the Vccp transistor 590 illustrated, for example a resistor, a plurality of resistors, a plurality of transistors, a combination of resistors and transistors, or other devices or combinations known in the art. One advantage of this configuration is that if multiple digit lines are additionally equalized to each other (e.g., shorted together), then only one source voltage element (e.g., Vccp transistor 590) is required to hold the multiple digit lines to the desired voltage, (e.g., VCC/2).

FIG. 4 illustrates a single sense amplifier 110 for simplicity. It should be understood that in actual practice, and as shown in FIG. 5, a plurality of FIG. 4 circuits would be used for access and control of a memory device 500, where each circuit would read/write one data bit on a selected word line. For example, in a 4 bit data arrangement four sense amplifiers 110 of the type illustrated in FIG. 3 would be fabricated and share the RNL_, ACT, CS, COM and LEQ signals.

Since the sense amplifiers 110 are arranged perpendicular to the digit lines 102, 104, extra interconnect spaces become available parallel to the digit lines 102, 104. The extra interconnect spaces may be used for control signals, power strapping, or local interconnection for other devices.

FIG. 4 is a top down illustration of the physical layout of a portion 500' of the memory device 500 illustrated in FIG. 3. As noted, the layout employs an open sense amplifier arrangement with the sense amplifier 110 oriented perpendicular to the extending direction of the digit lines 102, 104. The sense amplifier 110 of circuit of FIG. 4 is electrically equivalent to the sense amplifier 110 illustrated in FIG. 3. The sense amplifier 110 contains two n-channel transistors 230, 232 and two p-channel transistors 234, 236, and has a length which extends in a direction shown horizontally in FIG. 4. The digit lines 102, 104 enter from the top and bottom, respectively, in FIG. 4 and run in a direction (shown vertically in FIG. 4) perpendicular to the length of the sense amplifier 110. Interconnects 414, 410 between the p-channel transistors 234, 236 and n-channel transistors 232, 230, respectively, extend in a direction parallel to the length of the sense amplifier 110 (shown horizontally in FIG. 4) and perpendicular to the extending direction of the digit lines 102, 104. As a result, the digit lines 102, 104 may be connected at multiple places along the interconnects 414, 410, respectively, allowing considerable design flexibility. N-well 502 includes within it the active area 504 forming the source/drain regions of the p-channel transistors 234, 236. Likewise, active area 506 forms the source/drain regions of the n-channel transistors 230, 232. The transistors 290, 292 are illustrated between source/drain regions of the n-channel transistors 230, 232 and the node COM (e.g., node 584 on FIG. 3) for selective coupling of the digit lines 102, 104 during equalization. Input/output devices 240, 242 (FIG. 3) and a source voltage element, e.g., a Vccp transistor 590 (FIG. 3), are omitted from FIG. 4 for simplicity.

Figure 7:
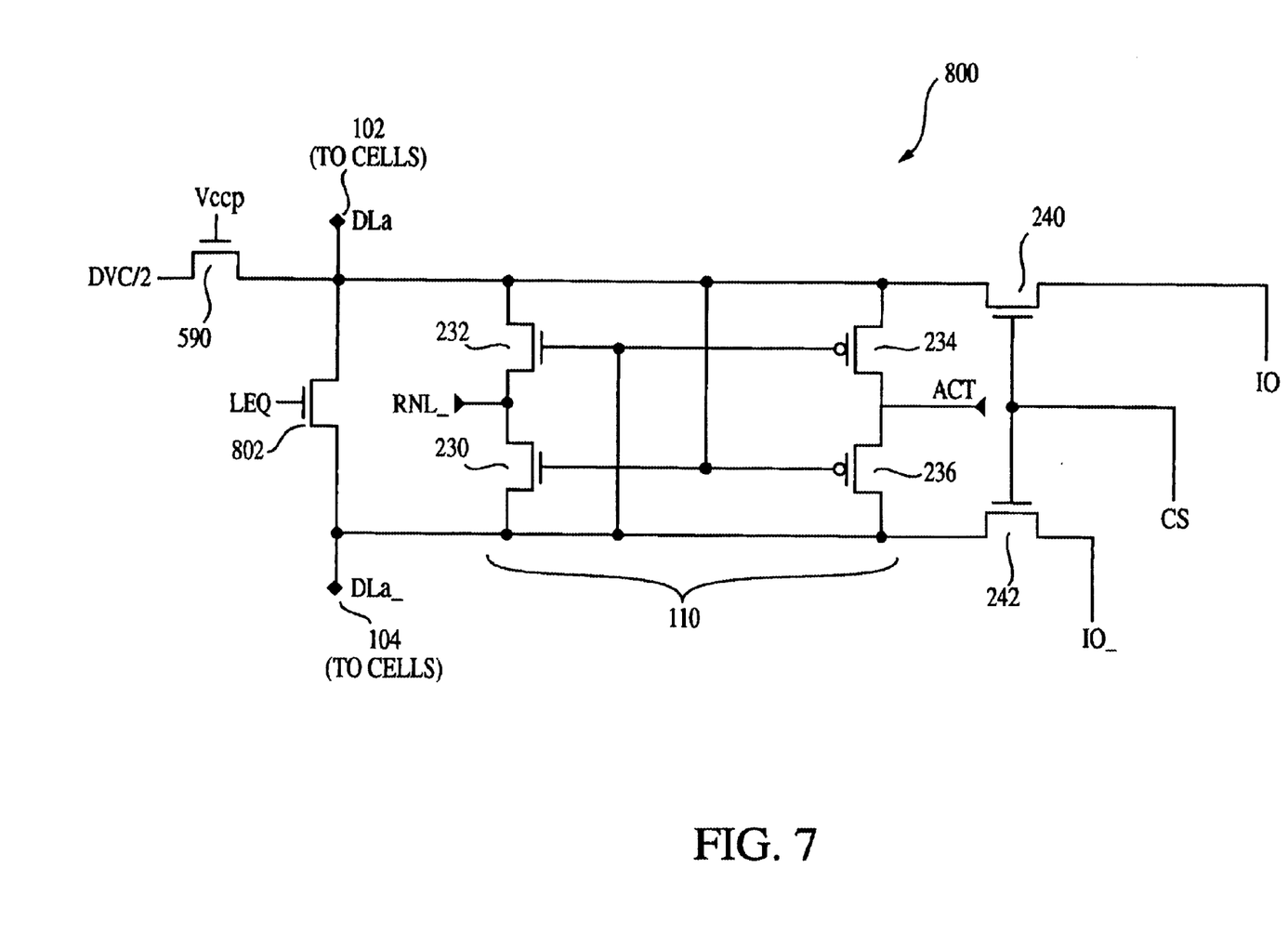
FIG. 7 is an electrical schematic diagram of a portion of a memory device fabricated in accordance with another exemplary embodiment of the invention.
Figure 8:
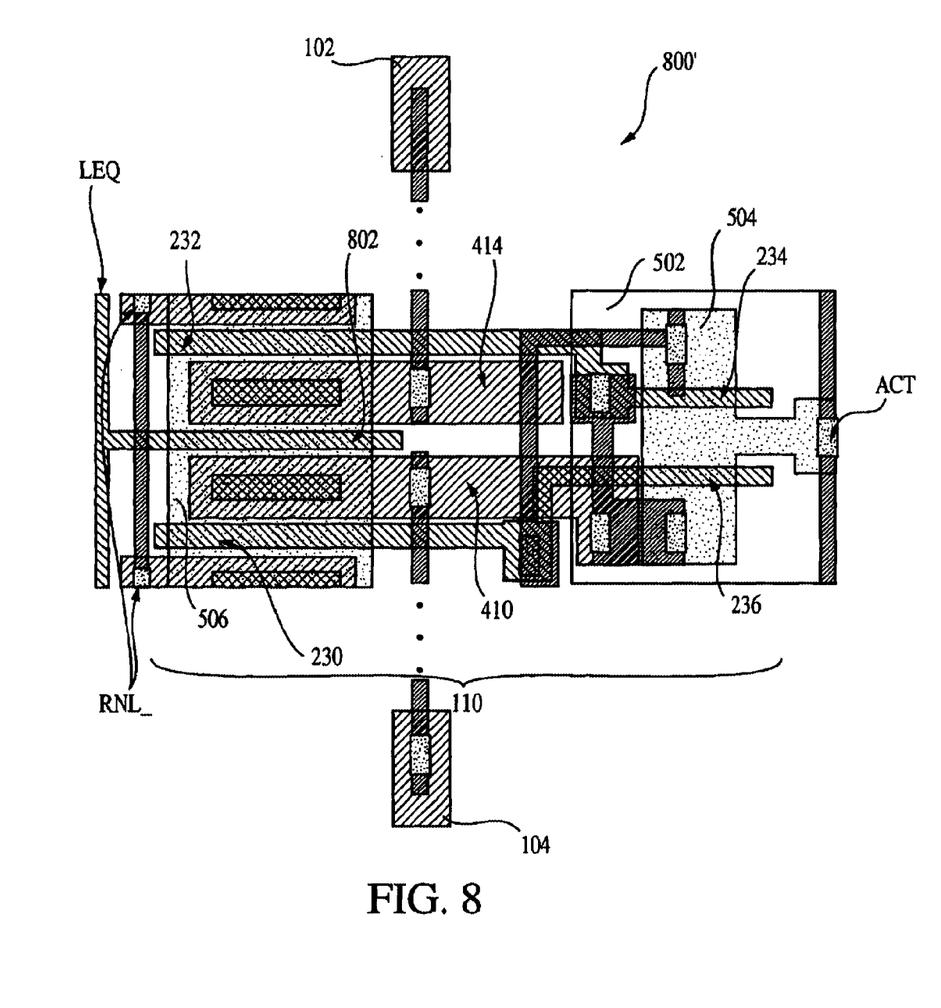
FIG. 8 is a layout illustration of a portion of the memory device illustrated in FIG. 7.

FIGS. 7 and 8 illustrate a memory device 800 constructed in accordance with another exemplary embodiment of the invention. Referring to FIG. 7, the device 800 places an equalization device 802 between the two n-channel transistors 230, 232. In doing so, the device does not require that a plurality of transistors 290, 292 and a COM node 584 (FIG. 4) be used for equalization. The digit lines 102, 104 can be equalized through the equalization device 802 as controlled by the LEQ signal. A voltage source DVC/2 (e.g., at VCC/2) connected through a source voltage element, e.g., a Vccp transistor 590, may also be used to hold the digit lines 102, 104 to a desired voltage, e.g., VCC/2, during equalization as shown in FIG. 7. As noted, one advantage of this configuration is that if multiple digit lines are additionally equalized to each other (e.g., shorted together), then only one source voltage element (e.g., Vccp transistor 590) is required to hold the multiple digit lines to the desired voltage, (e.g., VCC/2). Also as noted, Vccp transistor 590 is not required for the source voltage element, and it may also be a resistor, a plurality of resistors, a plurality of transistors, a combination of these, or other elements known in the art.

Referring to FIG. 8, a top down view is illustrated of the physical layout for a portion 800' of the memory device 800 depicted in FIG. 7. The portion 800' of FIG. 7 illustrated in FIG. 8 includes the digit lines 102, 104, the sense amplifier 110 and the equalization device 802. The equalization device 802 is located between the interconnects 410, 414 coupled to the digit lines 102, 104, and is coupled to LEQ on the periphery for selective connection of the digit lines 102, 104 during equalization. Again, n-well 502 includes within it the active area 504 forming the source/drain regions of the p-channel transistors 234, 236. Likewise, active area 506 forms the source/drain regions of the n-channel transistors 230, 232, as well as for the equalization device 802.

Figure 6:
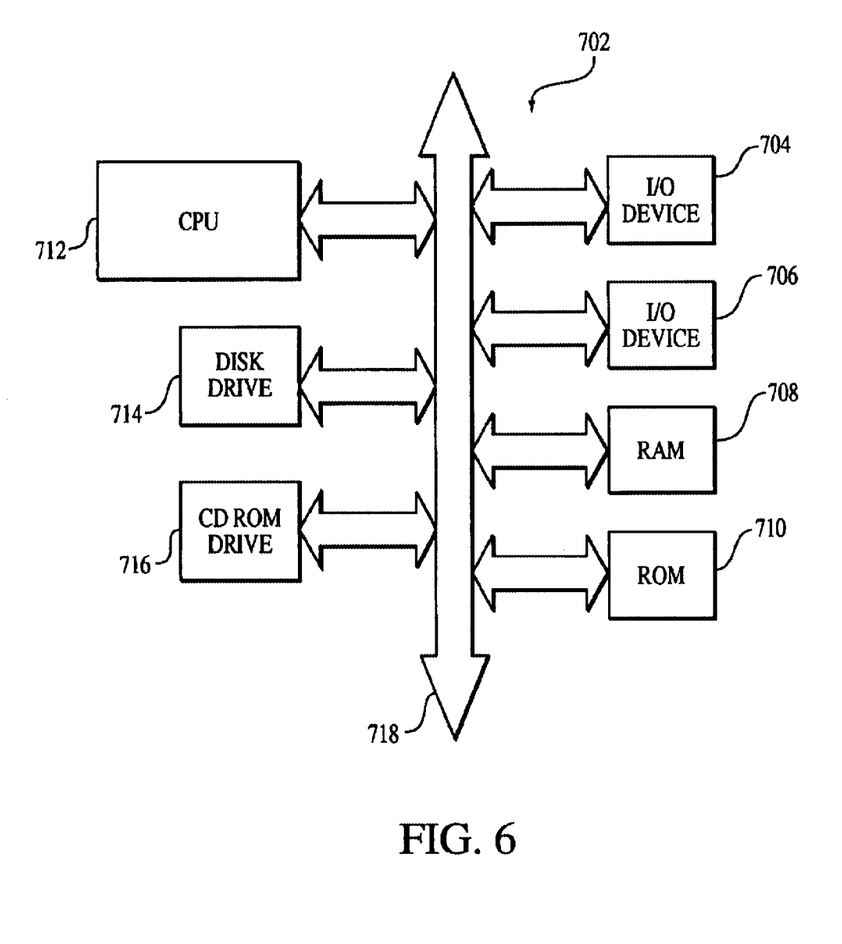
FIG. 6 illustrates a processor system employing a memory device containing an open digit array sense amplifier arrangement in accordance with another exemplary embodiment of the present invention.

FIG. 6 illustrates a simplified processor system 700 which may employ RAM devices 708 containing the sense amplifier arrangement described and illustrated with reference to FIGS. 3–5 and 7–8. Processor system 700 includes central processing unit (CPU) 712, RAM memory devices 708 and ROM memory devices 710, and may also include input/output (I/O) devices 704, 706, disk drive 714 and CD ROM drive 716. All of the above components communicate with each other over bus 718. RAM memory devices 708 and CPU 712 may also be integrated together on a single chip.

Although the invention has been described as providing benefits for arrays having 6F2 memory cell arrangements, the present invention may also be used for 8F2 memory arrays and others.

Accordingly, it is to be understood that the above description is intended to be illustrative of the invention and not restrictive. Many variations, modifications and substitutions for the structures described and illustrated herein will be readily apparent to those having ordinary skill in the art. The present invention is not to be considered as limited by the specifics of the described and illustrated embodiment, but is only limited by the scope of the appended claims.

What is claimed as new and desired to be protected by Letters Patent of the United States is:

1. An integrated circuit memory device, comprising:
   at least one sense amplifier fabricated over a substrate and comprising:
      first and second transistors being of one of a p-channel and n-channel type:
      third and fourth transistors being of the other of said p-channel and n-channel type;
      a first interconnect line connecting said first and third transistors;
      a second interconnect line connecting said second and fourth transistors;
   an equalization circuit; and
   a pair of digit lines coupled to said at least one sense amplifier by said first and second interconnect lines, wherein said first and second transistors and said equalization circuit are on a first side of said pair of digit lines, and said third and fourth transistors are on a second side of said pair of digit lines.

2. The integrated circuit memory device of claim 1, wherein said third and fourth transistors are p-channel transistors and said first and second transistors are n-channel transistors.

3. The integrated circuit memory device of claim 1, further comprising a pair of memory sub-arrays, each containing a plurality of memory cells, each of said digit lines being connected to a respective sub-array.

4. The integrated circuit memory device of claim 1, wherein said equalization circuit comprises a pair of serially connected transistors having a common node at a serial connection point, gates of said serially connected transistors receiving an equalization control signal.

5. The integrated circuit memory device of claim 1, wherein said equalization circuit comprises at least two transistors, each transistor having two source/drain regions, one of said two source/drain regions of each of said equalization circuit transistors being coupled to a respective one of said pair of said digit lines, gates of said transistors receiving an equalization control signal.

6. The integrated circuit memory device of claim 1, further comprising an input/output transistor to selectively control the input and output of data to and from said at least one sense amplifier, said input/output transistor coupled to one of said digit lines.

7. The integrated circuit memory device of claim 1, further comprising a voltage source equaling approximately one-half of a power supply voltage, said voltage source being coupled to at least one of said digit lines through a source voltage element.

8. The integrated circuit memory device of claim 7, wherein said source voltage element includes a transistor.

9. The integrated circuit memory device of claim 7, wherein said source voltage element includes a resistor.

10. The integrated circuit memory device of claim 2, wherein said third and fourth p-channel transistors are coupled at a common node.

11. The integrated circuit memory device of claim 2, wherein said first and second n-channel transistors are coupled at a common node.

12. The integrated circuit memory device of claim 1, further comprising a plurality of memory sub-arrays, wherein said at least one sense amplifier is coupled to two of said plurality of sub-arrays, each of said digit lines being coupled to a respective sub-array, thereby eliminating the need for isolation transistors.

13. A memory circuit, comprising:
   a plurality of sense amplifiers fabricated over a substrate each of said sense amplifiers comprising:
      a pair of p-channel transistors and a pair of n-channel transistors, said pair of n-channel transistors being associated with a first active area;
      a first interconnect line connecting one of said p-channel transistors with one of said n-channel transistors;
      a second interconnect line connecting the other of said p-channel transistor with the other of said n-channel transistor;
   an equalization circuit comprising of at least two n-channel transistors being associated with said first active area; and
   a pair of digit lines coupled to each of said sense amplifiers respectively connected between said pair of p-channel transistors and said pair of n-channel transistors at said first and second interconnect lines such that said pair of p-channel transistors are on a first side of said pair of digit lines, and said pair of n-channel transistors and said equalization circuit are on a second side of said pair of digit lines.

14. The memory circuit of claim 13, further comprising a pair of memory sub-arrays, each containing a plurality of memory cells, each of said digit lines being connected to a respective sub-array.

15. The memory circuit of claim 13, wherein said at least two n-channel transistors of said equalization circuit are serially connected transistors and have a common node at a serial connection point, gates of said serially connected n-channel transistors receiving an equalization control signal.

16. The memory circuit of claim 13, wherein each of said at least two n-channel transistors of said equalization circuit has two source/drain regions, one of said two source/drain regions of each of said equalization circuit transistors being coupled to a respective one of said pair of said digit lines, gates of said transistors receiving an equalization control signal.

17. The memory circuit of claim 13, further comprising an input/output transistor to selectively control the input and output of data to and from said at least one sense amplifier, said input/output transistor coupled to one of said digit lines.

18. The memory circuit of claim 13, further comprising a voltage source equaling approximately one-half of a power supply voltage, said voltage source being coupled to at least one of said digit lines through a source voltage element.

19. The memory circuit of claim 18, wherein said source voltage element includes a transistor.

20. The memory circuit of claim 18, wherein said source voltage element includes a resistor.

21. The memory circuit of claim 13, wherein said pair of p-channel transistors are coupled at a common node.

22. The memory circuit of claim 13, said pair of n-channel transistors are coupled at a common node.

23. The memory circuit of claim 13, further comprising a plurality of memory sub-arrays, wherein said at least one sense amplifier is coupled to two of said plurality of sub-arrays, each of said digit lines being coupled to a respective sub-array, thereby eliminating the need for isolation transistors.

24. A processor system, comprising:
a processor; and
memory device coupled to said processor, said memory device comprising:
at least one sense amplifier fabricated over a substrate comprising:
first and second n-channel transistors;
first and second p-channel transistors;
a first interconnect line connecting said first n-channel and said first p-channel transistors;
a second interconnect line connecting said second n-channel and said second p-channel transistors;
an equalization circuit; and
a pair of digit lines coupled to said at least one sense amplifier by said first and second interconnect lines such that said first and second n-channel transistors and said equalization circuit are on a first side of said pair of digit lines, and said first and second p-channel transistors are on a second side of said pair of digit lines.

25. The system of claim 24, further comprising a pair of memory sub-arrays, each containing a plurality of memory cells, each of said digit lines being connected to a respective sub-array.

26. The processor system of claim 24, wherein said equalization circuit comprises a pair of serially connected transistors having a common node at a serial connection point, gates of said serially connected transistors receiving an equalization control signal.

27. The processor system of claim 24, wherein said equalization circuit comprises at least two transistors, each transistor having two source/drain regions, one of said two source/drain regions of each of said equalization circuit transistors being coupled to a respective one of said pair of said digit lines, gates of said transistors receiving an equalization control signal.

28. The processor system of claim 24, further comprising an input/output transistor to selectively control the input and output of data to and from said at least one sense amplifier, said input/output transistor coupled to one of said digit lines.

29. The processor system of claim 24, further comprising a voltage source equaling approximately one-half of a power supply voltage, said voltage source being coupled to at least one of said digit lines through a source voltage element.

30. The processor system of claim 29, wherein said source voltage element includes a transistor.

31. The processor system of claim 29, wherein said source voltage element includes a resistor.

32. The processor system of claim 24, wherein said first and second p-channel transistors are coupled at a common node.

33. The processor system of claim 24, wherein said first and second n-channel transistors are coupled at a common node.

34. The processor system of claim 24, further comprising a plurality of memory sub-arrays, wherein said at least one sense amplifier is coupled to two of said plurality of sub-arrays, each of said digit lines being coupled to a respective sub-array, thereby eliminating the need for isolation transistors.

35. An integrated memory circuit, comprising:
a die containing a processor and a memory device, said memory device comprising:
at least one sense amplifier fabricated over a substrate comprising:
first and second n-channel transistors
first and second p-channel transistors;
a first interconnect line connecting said first n-channel and said first p-channel transistors;
a second interconnect line connecting said second n-channel and said second p-channel transistors;
an equalization circuit; and
a pair of digit lines coupled to said at least one sense amplifier by said first and second interconnect lines such that said first and second n-channel transistors and said equalization circuit are on a first side of said pair of digit lines, and said first and second p-channel transistors are on a second side of said pair of digits lines.

36. The integrated memory circuit of claim 35, further comprising a pair of memory sub-arrays, each containing a plurality of memory cells, each of said digit lines being connected to a respective sub-array.

37. The integrated memory circuit of claim 35, wherein said equalization circuit comprises a pair of serially connected transistors having a common node at a serial connection point, gates of said serially connected transistors receiving an equalization control signal.

38. The integrated memory circuit of claim 35, wherein said equalization circuit comprises at least two transistors, each transistor having a pair of source/drain regions, one of said two source/drain regions of each of said equalization circuit transistors being coupled to a respective one of said pair of said digit lines, gates of said equalization transistor receiving an equalization control signal.

39. The integrated memory circuit of claim 35, further comprising an input/output transistor to selectively control the input and output of data to and from said at least one sense amplifier, said input/output transistor coupled to one of said digit lines.

40. The integrated memory circuit of claim 35, further comprising a voltage source equaling approximately one-half of a power supply voltage, said voltage source being coupled to at least one of said digit lines through a source voltage element.

41. The integrated memory circuit of claim 40, wherein said source voltage element includes a transistor.

42. The integrated memory circuit of claim 40, wherein said source voltage element includes a resistor.

43. The integrated memory circuit of claim 35, wherein said first and second p-channel transistors are coupled at a common node.

44. The integrated memory circuit of claim 35, wherein said first and second n-channel transistors are coupled at a common node.

45. The integrated memory circuit of claim 35, further comprising a plurality of memory sub-arrays, wherein said at least one sense amplifier is coupled to two of said plurality of sub-arrays, each of said digit lines being coupled to a respective sub-array, thereby eliminating the need for isolation transistors.

46. A memory circuit, comprising:
    a plurality of sense amplifiers fabricated over a substrate each of said sense amplifiers comprising:
        two p-channel transistors and two n-channel transistors;
        a first interconnect line connecting a gate of one of said p-channel transistors with a gate of one of said n-channel transistors, said first interconnect line being substantially linear;
        a second interconnect line connecting a gate of the other of said p-channel transistors with a gate of the other of said n-channel transistors, said second interconnect line being substantially linear; and
        a pair of digit lines coupled to each of said sense amplifiers such that said two p-channel transistors are on a first side of said pair of digit lines, and said two n-channel transistors are on a second side of said pair of digit lines, and said pair of digit lines are coupled orthogonally to respective interconnect lines.

47. The memory circuit of claim 46, further comprising an equalization circuit for equalizing said pair of digit lines.

48. The memory circuit of claim 47, wherein said equalization circuit comprises a pair of serially connected transistors having a common node at a serial connection point, the gates of said serially connected transistors receiving an equalization control signal.

49. The memory circuit of claim 47, wherein said pair of transistors of said equalization circuit are n-channel transistors.

50. The memory circuit of claim 46, wherein said pair of transistors of said equalization circuit have respective gates arranged orthogonally to the gates of said two n-channel transistors of said sense amplifier.

51. The memory circuit of claim 47, wherein said equalization circuit is on said first side of said pair of digit lines coupled to said sense amplifier.

* * * * *